March 31, 1970 R. R. HABERECHT 3,503,125

METHOD OF MAKING A SEMICONDUCTOR MULTI-STACK FOR REGULATING CHARGING OF CURRENT PRODUCING CELLS

Original Filed Sept. 21, 1961

INVENTOR
ROLF R. HABERECHT
BY
Robert Lewis
ATTORNEY

United States Patent Office 3,503,125
Patented Mar. 31, 1970

3,503,125
METHOD OF MAKING A SEMICONDUCTOR MULTI-STACK FOR REGULATING CHARGING OF CURRENT PRODUCING CELLS

Rolf R. Haberecht, Indianapolis, Ind., assignor to P. R. Mallory & Co., Inc., Indianapolis, Ind., a corporation of Delaware Original application Sept. 21, 1961, Ser. No. 139,704, now Patent No. 3,274,454, dated Sept. 20, 1966. Divided and this application Apr. 18, 1966, Ser. No. 562,984
Int. Cl. B01j *17/00;* B23k *31/02*
U.S. Cl. 29—576 5 Claims

ABSTRACT OF THE DISCLOSURE

A method for preparing a composite stacked semiconductor device including providing a plurality of semiconductor wafers having surfaces thereof coated with a layer of conductive metal, stacking said wafers so that each pair of adjacent surfaces are coated with the conductive metal and heating said stack of wafers under pressure whereby said metal coating bonds said adjacent wafers together and forms a bonded composite of stacked wafers.

This is a divisional of application Ser. No. 139,704, filed Sept. 21, 1961, now Patent No. 3,274,454.

This invention relates to semiconductor devices, and more particularly to a composite semiconductor device comprising an integral stack of a plurality of semiconductor rectifier wafers. The invention additionally relates to methods of preparing such a composite stacked semiconductor device.

A characteristic of semiconductor junction rectifiers which makes them well suited to application as voltage-sensitive current gating elements is that such a rectifier switches from a substantially nonconductive condition to one of very high conductivity when the voltage across it in the reverse or normally nonconductive direction reaches a well-defined level known as the "Zener voltage." However, since the lowest Zener voltage of existing semiconductor rectifiers is about 2.6 volts, there exist many applications for which this type of gating characteristic cannot be employed. For example, as described in co-pending application Ser. No. 95,291, filed Mar. 13, 1961, and assigned to applicant's assignee, an electrochemical cell may be charged from a relatively high voltage source without danger of being overcharged by shunting the cell with a normally nonconductive voltage-sensitive current gating device. The device becomes highly conductive, however, when the terminal voltage of the cell reaches a prescribed level corresponding to the fully charged condition. Consequently, once that condition has been attained any continued charging current from the source is bypassed around the cell and it cannot become overcharged. The voltage level for full charge for cells in present day usage ranges from about 1.7 to 2.3 volts, and so is considerably below the lowest attainable semiconductor rectifier Zener voltage.

A very much lower gating voltage level can be obtained by making use of the forward conduction characteristic of a semiconductor rectifier. That is, even though the voltage applied across the rectifier is in the normally conductive direction, no appreciable conduction occurs until it reaches a relatively low critical level. This level varies with different types of rectifiers depending on the semiconductor material employed, and is about 0.4 volt for germanium rectifiers, 0.6 volt for silicon rectifiers, and 1.1 volts for gallium arsenide rectifiers. Other compound semiconductors exhibit gating voltage levels ranging somewhat above and below that of gallium arsenide. Although these levels are much too low for battery charging, as well as for most other gating applications, two or more rectifiers may be connected in series to establish a resultant gating voltage level equal to the sum of those of the individual rectifiers. For example, the series combination of two silicon rectifiers and one germanium rectifier will have a gating voltage level of about 1.6 volts. This closely matches the voltage corresponding to full charge of an electrochemical cell of the type employing a cathode-depolarizer of silver oxide and mercuric oxide.

An obvious way of assembling a series combination of a number of individual semiconductor rectifiers is simply to solder or weld the leads of a succession of complete rectifier units together. However, since this results in an extremely bulky composite device, an alternative approach which has been employed is to stack the requisite number of rectifier wafers together with layers of solder sandwiched therebetween. The stack is then heated to melt the solder, whereby it bonds the wafers together. The completed assembly is then enclosed in a suitable casing. Semiconductor devices of this type are known as "stabistors." Unfortunately, it has been found that both these varieties of series rectifier combinations have gating characteristics which are considerably more gradual than any of the individual rectifier wafers comprised therein. This is a serious disadvantage in applications wherein a sharp change in conductivity is required at a well-defined gating voltage level. In addition, in the case of the soldered wafer stacks, the gating characteristic is further adversely effected by the relatively thick (approximately 1 mil) solder bonding layers included between the successive wafers. Spacing of this order therebetween cause an appreciable reduction in overall conductivity and result in non-uniformities in the current vs. voltage characteristic. The necessity for stacking and soldering the individual rectifier wafers together also places a lower limit on the minimum transverse dimensions of the wafers, inasmuch as they must be suspectible to mechanical handling for that purpose.

An object of the invention is to provide a composite stacked semiconductor device having a relatively sharp forward gating characteristic at a specified voltage level in a range below that obtainable with the Zener voltage of a semiconductor rectifier.

A further object is to provide a method of producing a composite stacked semiconductor device comprising a series of individual semiconductor junction rectifier wafers which are integrally bonded together, the spacings between successive wafers being only of the order of 0.1 mil.

A further object is to provide a composite stacked semiconductor device, and a method of producing the same, of extremely minute transverse dimensions of the order of 10 mils or less in diameter.

Briefly, a composite stacked semiconductor device in accordance with the invention comprises a plurality of individual semiconductor junction rectifier wafers respectively having a substantially planar transverse end surface on either side of the junction therein. At least one transverse end surface of two of said wafers and both transverse end surface of all remaining wafers are coated with a thin layer of conductive metal in low resistance ohmic contact therewith and which is of the same composition for all wafers. The wafers are stacked together in series so that each pair of adjacent surfaces of successive ones thereof are coated surfaces, and each such pair of adjacent surfaces is bonded together by fusion of the metal coatings thereon so as to form an integrally bonded composite stacked assembly.

Further in accordance with the invention, a process is provided for preparing a composite stacked semiconductor device comprising a series of individual wafers of selected semiconductor materials, both transverse end surfaces of each wafer being substantially planar. In one embodiment such a process comprises coating at least one transverse end surface of two of the wafers and both transverse end surfaces of all remaining wafers with a thin layer of conductive metal in low resistance ohmic contact therewith, such metal being of the same composition for all wafers. The wafers are next stacked together so that each pair of adjacent surfaces of successive ones thereof are coated surfaces. The stack is subsequently heated under longitudinal pressure in a reducing atmosphere to a temperature above the melting point of a eutectic binary alloy of the plating metal and any of the semiconductor wafer materials but below the melting point of any of those materials, thereby causing the metal coatings on adjacent surfaces of the wafers to fuse together and form an integrally bonded composite stacked assembly.

A more complete description of the invention, together with other objects and features thereof, is presented in the following specification with reference to the accompanying drawings; but it should be noted that the true scope of the invention is pointed out in the ensuing claims. In the drawings:

Figure 1:
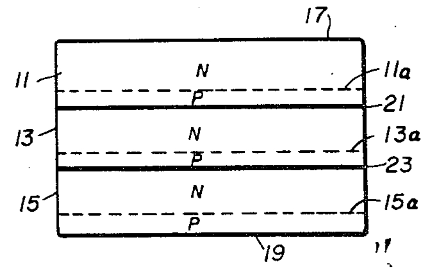
FIG. 1 is a cross-sectional diagram of a composite stacked semiconductor device constructed in accordance with the invention.

Referring to FIG. 1, the composite stacked semiconductor device shown therein in cross-section comprises a plurality of individual semiconductor PN junction rectifier wafers 11, 13 and 15 which respectively have a substantially planar transverse end surface on either side of the junction therein. The junctions have respectively been designated by the transverse planes 11*a*, 13*a* and 15*a*. At least one transverse surface of two of the wafers, such as wafers 11 and 15, and both transverse end surfaces of all remaining wafers, in this case wafer 13, are coated with a thin layer of conductive metal in low resistance ohmic contact therewith and which is of the same composition for all wafers. The metal coating employed is preferably nickel, and may be deposited on each surface by the well known "electroless" plating technique. A description of a suitable plating solution for this purpose may be found, for example, in the article appearing at pages 226–230 of the April 1957 issue of the Journal of the Electro-Chemical Society. Plating is effected by simply keeping the semiconductor wafer in the solution for a time determined by the coating thickness desired. Applicant has obtained satisfactory nickel coatings of the order of 0.05 mil in thickness on a silicon wafer by allowing the wafer to remain in solution for approximately two minutes at a temperature somewhat above 90° C. Of course, other conductive metals capable of being reliably plated on semiconductor materials may also be employed. The plating metal may also contain moderate amounts of additives, such as phosphorous, which serve to facilitate the subsequent bonding operation. As illustrated, wafers 11, 13 and 15 are stacked together in series so that each pair of adjacent wafers of successive ones thereof are coated surfaces. In addition, each such pair of adjacent wafers is bonded together by fusion of the metal coatings thereon so as to form an integrally bonded composite stacked assembly. Specifically, the nickel plated surface of wafer 11 is adjacent the upper surface of wafer 13, which is also nickel plated, and these surfaces are bonded together by fusion of the nickel platings thereon into the single bonding layer 21. This layer will consist of nickel alloyed with the semiconductor materials of which the respective wafers are composed. In similar manner, the nickel plated surface of wafer 15 is adjacent the bottom nickel plated surface of wafer 13, and is bonded thereto by fusion of those platings into the uniform bonding layer 23. The remaining exposed transverse surfaces 17 and 19 of the end wafers 11 and 15 are thus available for making electrical connections to the composite device. These surfaces can, if desired, also be nickel plated. Alternatively, a wire conductor can simply be soldered thereto to enable such connections to be made.

Each of rectifiers 11, 13 and 15 may be a diffused or alloyed PN junction wafer of germanium, silicon, or compound semiconducting material such as gallium arsenide. In addition, they may be of the same or different semiconductor materials as determined by the overall gating voltage level to be established. Each wafer is typically of the order of 10 mils thick and between 40 and 80 mils in diameter. To obtain a sharp gating characteristic, or a large change in conductivity for a small voltage increment at the gating voltage level, the semiconductor material of each wafer prior to junction formation therein should be of relatively low resistivity of the order of 0.1 ohm-centimeter. For example, applicant has constructed a stacked assembly of silicon rectifier wafers of which each was initially of N type conductivity containing phosphorous as a donor impurity in sufficient concentration to obtain a resistivity of 0.1 ohm-centimeter. A PN junction was then formed in each wafer by diffusion of boron as an acceptor impurity, the PN junction being formed somewhat nearer the surface of the P zone than that of the N zone in each wafer. After bonding of the surface of the P zone of each wafer to the surface of the N zone of the adjacent wafer, as described hereinafter, a bond region resulted therebetween which was found to extend somewhat further into the phosphorous rich N zone than into the boron rich P zone of the adjacent wafer. This suggests the possibility that the phosphorous plays some part in formation of the metallurgical bond between the wafers.

Figure 2:
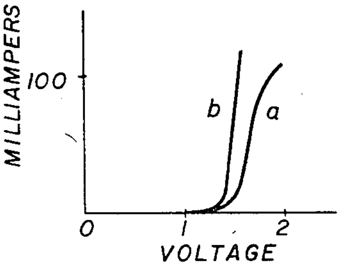
FIG. 2 is a graph showing the improvement in forward gating characteristic obtained with a composite stacked semiconductor device as in FIG. 1.

The thickness of the bond region between adjacent wafers in the stacked assembly of FIG. 1 is extremely thin in comparison with that obtainable with soldered bonds of the kind heretofore employed. That is, the thickness of each of bonding layers 21 and 23 may be less than 0.1 mil. In contrast, soldered bonds cannot practicably be established less than about 5 mils in thickness. A typical gating characteristic provided by a soldered semiconductor assembly of the type heretofore employed is shown by curve (*a*) in FIG. 2. It is seen that the voltage level at which transition from the nonconductive to the conductive state occurs is rather diffuse, and that the conductivity drops appreciably at current levels beyond about 100 milliamperes. In contrast, curve (*b*) in FIG. 2 shows the improved gating characteristic obtained with a bonded composite stacked semiconductor device in accordance with the invention. It is apparent that this gating characteristic is much better defined, gating occurring at a fairly distinct voltage level, and that the conductivity remains uniformly high at all current levels. This appears to be attributable to the extremely thin bonding layers existing between the successive individual wafers, thereby introducing negligible resistance between them and minimizing carrier recombination effects otherwise encountered in soldered stacks. An additional factor contributing to the improved performance of applicant's device is the extremely small transverse dimensions to which such device may be constructed. With a conventional soldered stack the physical handling requirements prevent use of wafers smaller than about 40 mils in diameter. In applicant's device, after the stacked assembly has been bonded it may be ultrasonically diced into a plurality of similar bonded stacks of the order of only 10 mils in diameter. Not only does this constitute an important saving in the space taken up by the device, but dimensions of this order have also been found to result in considerably sharper gating characteristics than larger units.

It should be recognized that besides permitting stacking of wafers of different semiconductor materials, the invention also enables assembly of stacks of diced wafers of different diameters. In this case, however, it is not practical to rely on dicing of a completely assembled composite stack in order to obtain the desired final dimensions. Instead, the individual wafers are first diced to the desired lateral dimensions and are then bonded into a composite stacked assembly as described. This is practical with a bonding structure as described, whereas it is not possible with the previously employed technique of soldering diced wafers together. This is because the solder between dice of different dimensions spreads out and shorts the smaller one. That does not occur when the bonding assembly employs only a thin layer of nickel plating on the wafers being bonded. Stacks of dice of different diameters have been found to have very good current gating characteristics at very low voltage and very low resistance at relatively low current levels.

Considering now the process by which a composite stacked semiconductor device as described may be prepared, it will be presupposed that the requisite number of individual wafers of the selected semiconductor materials are available and that each such wafer has substantially planar transverse end surfaces. As well known in the art, wafers of this type are constructed by taking a thin slice from a single crystal ingot of a semiconductor material such as germanium or silicon and which contains a suitable concentration of either a donor or acceptor impurity. Such slices are typically between three-quarters and one inch in diameter, and perhaps 20 mils thick. A transverse PN junction may then be formed therein by diffusing or alloying an impurity of the opposite type into one transverse surface, following which both surfaces are etched and lapped substantially planar. The resultant wafer will be a PN junction rectifier of the order of 10 mils thick.

Figure 4:
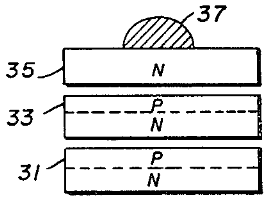
FIG. 4 is a cross-sectional diagram illustrating a modified process for preparing a composite stacked semiconductor device in accordance with the invention.

The process to which the invention is directed is one enabling preparation of a composite stacked semiconductor device comprising a series of individual wafers of selected semiconductor materials, both transverse and surfaces of each wafer being substantially planar. The first step of such a process is to coat at least one transverse end surface of two of the wafers and both transverse end surfaces of all remaining wafers with a thin layer of conductive metal in low resistance ohmic contact therewith, such metal being of the same composition for all wafers. Of course, if more convenient, both surfaces of all wafers may be so coated. The only exception to this is when the bonding process is to be used to simultaneously also effect formation of a PN rectifying junction in one of the end wafers, as described hereinafter in more detail with reference to FIG. 4. In that case the exposed surface of that wafer should be uncoated. As previously mentioned, the coating may be a layer of nickel of the order of 0.05 mil or less in thickness deposited on the wafer surfaces by electroless plating. When the desired thickness of nickel has been obtained the wafers are removed from the plating bath and rinsed in water to remove all traces of the plating solution. Any plating which has deposited in unwanted regions, such as on the longitudinal peripheral edges, is removed by grinding or conventional masking and etching treatment.

Figure 3:
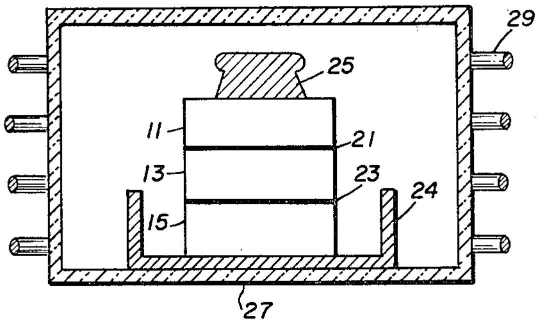
FIG. 3 is a cross-sectional diagram of an arrangement for bonding a series of stacked individual semiconductor wafers together in accordance with the process contemplated by the invention.

Having completed the plating operation, the wafers are stacked together so that each pair of adjacent surfaces of successive ones thereof are coated surfaces, and the stack is placed in a dish or "boat" 24 of graphite or quartz, as shown in FIG. 3. A weight 25 of five to ten pounds is placed on the stack to consolidate it under longitudinal pressure. Still supporting the stack, boat 24 is introduced into a furnace 27 which may then be hermetically sealed and the air therein replaced with a reducing atmosphere such as hydrogen gas. By means of an electrical heating coil 29 the temperature of the furnace is raised above the melting point of a eutectic binary alloy of the nickel or other plating metal employed and any of the semiconductor materials of wafers 11, 13 and 15, but below the melting point of any of those materials. This causes the contacting plated surfaces of adjacent wafers to fuse together into bonding layers such as layers 21 and 23, thereby forming an integrally bonded composite stacked assembly.

The proper temperature for effecting bonding in the manner described is dependent on the particular plating metal and semiconductor materials employed, and may be determined from the phase diagrams for binary alloys thereof. Specifically, the phase diagram for binary alloys of nickel and germanium, as shown for example at page 769 of the textbook "Constitution of Binary Alloys" by M. Hansen, published in 1958 by McGraw-Hill Book Company, exhibits a eutectic formation at 775° C. with the germanium constituting about 67% by weight of the eutectic alloy. Consequently, by heating a pair of thinly nickel plated germanium wafers to or slightly above a temperature of 775° C. they will become bonded together. Of course the temperature must not exceed the melting point of germanium, which occurs at 936° C. With respect to silicon and nickel, the phase diagram for binary alloys thereof is given at page 104D of the foregoing textbook and exhibits a eutectic formation at 964° C. containing about 89% by weight of silicon. Heating to or slightly above that temperature will therefore effect bonding of a pair of thinly nickel plated silicon wafers. In this case the temperature must not exceed 1417° C., which is the melting point of silicon. The phase diagram for binary alloys of nickel and silicon shows another eutectic formation at 806° C., which is above the melting point of the above-mentioned eutectic alloy of nickel and germanium. Consequently, heating to a temperature slightly above 806° C. but below the 936° C. melting point of germanium will effect bonding between nickel plated germanium and silicon wafers.

It is also possible to effect junction formation in an initially P or N type germanium wafer simultaneously with bonding one surface of the wafer to a silicon wafer in which a PN junction has already been formed. A process of this type is employed in FIG. 4, wherein is shown a still unbonded stack including two adjacent silicon PN junction rectifiers 31 and 33 which are nickel plated on each transverse end surface thereof. At the top end of the stack is a germanium wafer 35 which is wholly of N type conductivity, no junction yet having been formed therein. The surface of wafer 35 which is adjacent wafer 33 is nickel plated. However, the exposed top surface of wafer 35 has been left unplated. A pellet 37 of an acceptor or P type impurity, such as aluminum, is placed thereon. As with aluminum, the acceptor material should be one having a melting point lower than that of germanium. When such a stack is placed in a furnace as in FIG. 3, and the temperature is raised to above 806° C. but below 936° C., the adjacent surfaces of rectifiers 31 and 33 and of rectifier 33 and wafer 35 fuse together to produce the required composite bonded assembly. At the same time, aluminum pellet 37 melts and diffuses into the surface of germanium wafer 35, the diffusion depth being determined by the heating time and the precise temperature employed within the range indicated. A PN junction is thereby formed within wafer 35. Upon completion of the heating and bonding operation the upper surface of wafer 35 may be abrasively cleaned and lapped planar. It may then be nickel plated in the same manner as previously described in order to enable electrical connection to be made thereto, or alternatively a wire conductor can be soldered to the surface for that purpose.

The assembly produced as just described will constitute a composite stacked semiconductor device in accordance with the invention. However, when truly minute size is desired, it may be longitudinally diced into a plurality of such composite stacked device of much smaller transverse dimensions. That is, inasmuch as the wafers may initially be of the order of three-quarter inches to one inch in diameter, the composite stacked assembly thereof may be readily diced by an ultrasonic cutting machine into a plurality of composite stacked assemblies of the order of 10 mils or less in diameter. Suitable electrical leads can then be soldered, welded, or pressure bonded to the ends of each of the composite semiconductor devices so produced. Composite stacked semiconductor devices constructed by this method exhibit forward current gating characteristics nearly as sharp as the Zener voltage gating characteristic of conventional semiconductor diodes, and at very low forward voltages in the range between 1 and 2.5 volts.

While the invention has been described with reference to certain specific embodiments thereof, both as to its structure and method, it will be apparent to those skilled in the art that many modifications and variations thereof may be made without departing from the true teachings and scope of the invention as set forth in the ensuing claims.

What is claimed is:

1. A process for preparing a composite stacked semiconductor device comprising a series of individual silicon semiconductor wafers, both of the transverse end surfaces of each such wafer being substantially planar, said process comprising the steps of: plating at least one of the transverse end surfaces of two of said wafers and both transverse end surfaces of all remaining wafers with a layer of nickel in low resistance ohmic contact therewith and having a thickness in the order of about 0.05 mil or less, stacking said wafers together so that each pair of adjacent surfaces of successive ones thereof are plated surfaces; and heating said stack under longitudinal pressure in a reducing atmosphere to a temperature in the range of 964° C. to 1417° C. so as to cause the layers of nickel plating on adjacent surfaces of said wafers to fuse together and form an integrally bonded composite stacked assembly.

2. A process for preparing a composite stacked semiconductor device comprising a pair of adjacent individual semiconductor wafers of which one is primarily germanium and the other is primarily silicon, both of the transverse end surfaces of each of said wafers being substantially planar, said process comprising the steps of: plating at least one of the transverse end surfaces of each of said wafers with a thin layer of conductive metal in low resistance ohmic contact therewith, said metal being of the same composition of both wafers; stacking said wafers together so that the adjacent surfaces thereof are plated surfaces; and heating said stack under longitudinal pressure in a reducing atmosphere to a temperature above the melting point of a eutectic binary alloy of said plating metal with silicon as well as above the melting point of a eutectic binary alloy of such metal with germanium, but which is below the melting points of silicon and germanium, so as to cause the layers of metal plating on the adjacent surfaces of said wafers to fuse together and form an integrally bonded composite stacked assembly.

3. A process for preparing a composite stacked semiconductor device comprising a pair of adjacent individual semiconductor wafers of which one is primarily germanium and the other is primarily silicon, both of the transverse end surfaces of each of said wafers being substantially planar, said process comprising the steps of: plating at least one of the transverse end surfaces of each of said wafers with a thin layer of nickel in low resistance ohmic contact therewith; stacking said wafers together so that the adjacent surfaces thereof are plated surfaces; and heating said stack under longitudinal pressure in a reducing atmosphere to a temperature in the range of 806° C. to 936° C. so as to cause the layers of nickel plating on the adjacent surfaces of said wafers to fuse together and form an integrally bonded composite stacked assembly.

4. A process for preparing a composite stacked semiconductor device comprising a pair of adjacent individual semiconductor wafers of which the first is primarily germanium of one type conductivity and the second wafer is primarily silicon containing a PN junction therein, said process comprising the steps of: plating one of the transverse end surfaces of each of said wafers with a thin layer of nickel in low resistance ohmic contact therewith; stacking said wafers together so that the adjacent surfaces thereof are the plated surfaces; placing a pellet of an impurity material on the remaining surface of said germanium wafer, said impurity material having a melting point below 936° C. and being adapted to alter a region of said germanium wafer to the opposite type conductivity when diffused into such region thereof; and heating said stack under longitudinal pressure in a reducing atmosphere to a temperature in the range of 806° C. to 936° C. so as to cause said impurity material to diffuse into said germanium wafer and produce a PN junction therein while simultaneously causing the layers of nickel plating on the adjacent surfaces of said wafers to fuse together and form an integrally bonded composite stacked assembly.

5. In a method for preparing a composite stacked semiconductor device comprising a series of individual wafers of semiconductor material, said method comprising the steps of:

providing a plurality of said wafers including at least one surface thereof coated with a layer of conductive metal having a thickness in the order of about 0.05 mil or less, stacking said wafers so that at least one surface of each pair of adjacent surfaces of said contacting stacked wafers have a surface coated with said conductive material, heating said stack of said wafers under a pressure to a temperature above the melting point temperature of an alloy of said coating metal and any of said semiconductor wafer materials but below the melting point of any of said materials whereby said metal coating bonds said adjacent wafers together and forms a bonded composite of stacked wafers, wherein said stack includes a wafer of silicon and a wafer of germanium, and wherein said heating of said stack is carried out in a reducing atmosphere.

References Cited

UNITED STATES PATENTS

| | | | |
|---|---|---|---|
| 2,701,326 | 1/1955 | Pfann et al. | |
| 2,709,147 | 5/1955 | Ziegler | 29—472.7 X |
| 2,743,201 | 4/1956 | Johnson et al. | 148—184 |
| 2,790,940 | 4/1957 | Prince. | |
| 2,793,420 | 5/1957 | Johnston et al. | 29—590 |
| 3,148,038 | 9/1964 | Wolfe | 29—502 X |

PAUL M. COHEN, Primary Examiner

U.S. Cl. X.R.

29—472.7, 502, 589; 148—187